United States Patent [19]
Zhang

[11] Patent Number: 6,087,849
[45] Date of Patent: Jul. 11, 2000

[54] SOFT ERROR IMMUNITY IN CMOS CIRCUITS WITH LARGE SHARED DIFFUSION AREAS

[75] Inventor: Kevin X. Zhang, Portland, Oreg.

[73] Assignee: Intel Corporation, Santa Clara, Calif.

[21] Appl. No.: 09/159,463

[22] Filed: Sep. 23, 1998

[51] Int. Cl.[7] .................. H03K 19/23; H03K 19/094; H01L 29/167; H01L 23/552

[52] U.S. Cl. .................. 326/34; 326/34; 326/31; 326/26; 326/27; 326/119; 326/112; 326/121; 257/921; 257/659

[58] Field of Search .................. 326/34, 31, 26, 326/27, 112, 119, 121; 257/921, 659

[56] References Cited

U.S. PATENT DOCUMENTS

| | | | |
|---|---|---|---|
| 5,053,848 | 10/1991 | Houston et al. | 357/51 |
| 5,065,048 | 11/1991 | Asai et al. | 307/443 |
| 5,220,192 | 6/1993 | Owens et al. | 257/519 |
| 5,301,146 | 4/1994 | Hama | 365/154 |
| 5,365,478 | 11/1994 | Shimohigashi et al. | 365/189.01 |
| 5,432,463 | 7/1995 | Wong et al. | 326/32 |
| 5,541,528 | 7/1996 | Montoye et al. | 326/34 |
| 5,661,411 | 8/1997 | Nguyen | 326/21 |
| 5,691,089 | 11/1997 | Smayling | 257/40 |
| 5,732,037 | 3/1998 | Shimohigashi et al. | 365/205 |
| 5,973,541 | 10/1999 | Rajivan et al. | 327/374 |

*Primary Examiner*—Michael Tokar
*Assistant Examiner*—Vibol Tan
*Attorney, Agent, or Firm*—Blakely, Sokoloff, Taylor & Zafman LLP

[57] ABSTRACT

A CMOS logic circuit comprises a logic gate having an input node (e.g., a storage node) coupled to a positive supply potential through a p-type field-effect transistor (PFET), with one or more n-type field-effect transistors (NFETs) being coupled between the storage node and a negative supply potential. Since the response of the circuit to a high-energy particle strike is dominated by the N+ diffusion associated with the NFETs when the state of the storage node is high, i.e., a logical "1", the gate has a switching point that is set closer to the negative supply potential than to the positive supply potential.

10 Claims, 3 Drawing Sheets

6,087,849

SOFT ERROR IMMUNITY IN CMOS CIRCUITS WITH LARGE SHARED DIFFUSION AREAS

RELATED APPLICATIONS

This application is related to co-pending applications: Serial No. 09/159,464, filed Sep. 20, 1998, entitled, "A CMOS Register File With Soft Error Immunity"; Serial No. 09/159,446, filed Sep. 23, 1998, entitled, "Method for Evaluating Soft Error Immunity of CMOS Circuits"; and Serial No. 09/159,465, filed Sep. 28, 1998, entitled, "A CMOS Latch Design With Soft Error Immunity"; all of which are assigned to the assignee of the present application.

FIELD OF THE INVENTION

The present invention relates generally to the field of integrated circuits; more particularly, to methods and apparatus for protecting chip circuitry against the harmful effects of radiation.

BACKGROUND OF THE INVENTION

Recently there has been concerted effort among researchers and engineers to protect integrated chip circuitry from the troubling effect of natural background radiation. Natural background radiation, in the form of energetic alpha particles and neutrons, has become an increasingly difficult problem to solve as transistor size shrinks with each new generation of chips. High-energy particle irradiation can corrupt data stored in memory chips, producing what engineers refer to as "soft errors". As the semiconductor industry progresses toward line widths as fine as 0.18 microns, soft errors in data pose a major challenge.

A number of different approaches have been tried to reduce soft error rates in semiconductor devices. By way of example, U.S. Pat. No. 5,691,089 discloses a transistor device in which a doped layer of a radiation sensitive material is formed over a substrate. The radiation sensitive material may be polyamide or a similar organic dielectric. The inventors attribute improved alpha particle immunity to the complete isolation of the SRAM array by the organic dielectric layer.

A semiconductor memory array that reduces the probability of soft errors ascribable to alpha particles is also described in U.S. Pat. Nos. 5,365,478 and 5,732,037. These patents disclose a circuit solution applied to a dynamic random-access memory (DRAM). Another example is provided in U.S. Pat. No. 5,065,048, which teaches specialized precharging operations that enlarge the soft error margin against alpha particle strikes in CMOS and BiCMOS logic circuits. Yet another approach to the problem of soft errors in semiconductor memory devices is described in U.S. Pat. No. 5,301,146.

As will be seen, the present invention covers a generalized CMOS logic circuit that provides improved soft error immunity without added complexity or additional protection circuitry. The simple, elegant circuit approach offered by the invention can be advantageously employed in any CMOS logic gate having a storage node that is dominated by either N+ or P+ diffusion regions.

SUMMARY OF THE INVENTION

A CMOS logic circuit providing robustness against soft errors is disclosed. In one embodiment, the logic circuit comprises a storage node to store a logic state. A p-type field-effect transistor (PFET) is coupled between a positive supply potential and the storage node. One or more n-type field-effect transistors (NFETs) are coupled between the storage node and a negative supply potential. When a high-energy particle strikes the logic circuit, electron-hole pairs are generated. The response of the storage node to the high-energy particle strike is dominated by the N+ diffusion associated with the NFETs when the state of the storage node is high, i.e., a logical "1".

To combat this effect, the CMOS gate that has the storage node as its input node has a switching point that is set closer to the negative supply potential than to the positive supply potential to improve the soft error immunity of the node. Specifically, the robustness of the circuit to a logical "1 to 0" transition is significantly improved.

BRIEF DESCRIPTION OF THE DRAWINGS

The present invention is illustrated by way of example, and not by way of limitation, in the figures of the accompanying drawings, wherein.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative, rather than a restrictive, sense.

Figure 1:
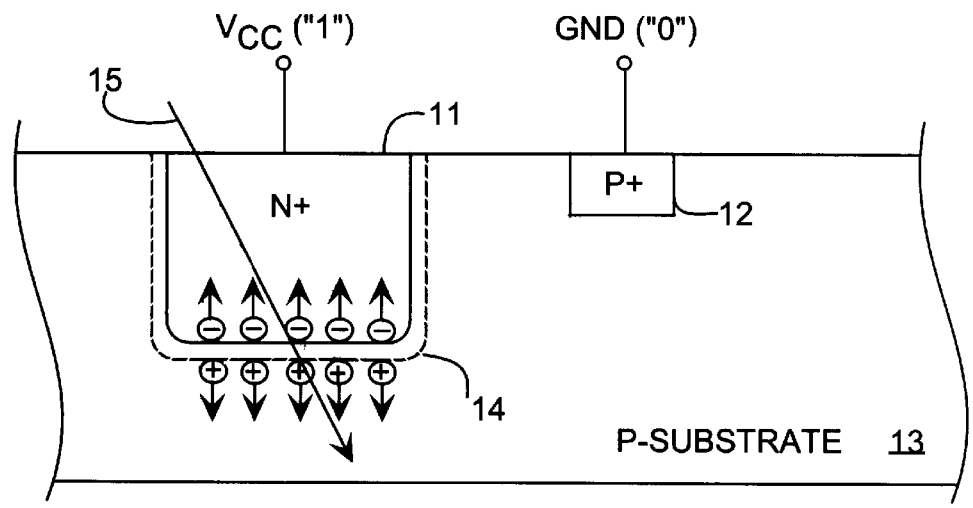
FIG. 1 illustrates a high-energy particle strike at a storage node comprising a N+ diffusion region.

With reference to FIG. 1, there is shown a cross-sectional view of a semiconductor storage node comprising an N+ diffusion region 11 formed within a P-type substrate 13. A P+ diffusion region 12 provides electrical connection to substrate 13. As shown in FIG. 1, N+ diffusion region 11 is coupled to a logical high level (e.g., $V_{CC}$ or "1") while the substrate, through P+ diffusion region 12, is coupled to a logical low level (e.g., ground or "0"). Because diffusion region 11 is at a higher voltage potential than the underlying substrate 13, a reverse biased PN junction is formed with an associated depletion region as shown in FIG. 1 by dashed line 14. When the storage node is struck by a particle such as an alpha or neutron particle, a large number of electron-hole pairs are generated. Because of the strong electric field that exists across depletion region 14 due to the storage node being reverse biased (i.e., the N+ diffusion region 11 is at a $V_{CC}$ potential and the P substrate 13 is at ground or $V_{SS}$ potential), excess electrons produced by the particle strike are swept across the electric field into the storage node. This is shown in FIG. 1 by the negative and positive charges being collected on opposite sides of the PN junction in response to a particle strike represented by arrow 15.

It is known that the area of a reverse-biased diffusion region at a storage node is proportional to the failure rate of the node. However, when a PN junction is not reverse-biased, e.g., the N+/P junction has the same potential on both sides of the N+ diffusion region 11 and the P substrate 13, the majority of electrons or holes generated by a particle strike are not swept into the storage node. This is because there is no strong electric field that exists across the PN junction when both sides are at the same potential. Instead, electrons or holes that are generated by a particle strike gradually recombine in the substrate.

What this means is that a storage node having a large N+ diffusion region is only prone to the transition from a logical high to a logical low state (i.e., from "1" to "0"). On the other hand, a storage node having a large P+ diffusion is only prone to the logical low to the logical high transition (i.e., from "0" to "1"). To repeat, this is because of the collection of the electrons or holes at the storage node which, if sufficiently large, can cause the state at the storage node to transition or "flip" to the opposite logic state.

Figure 2:
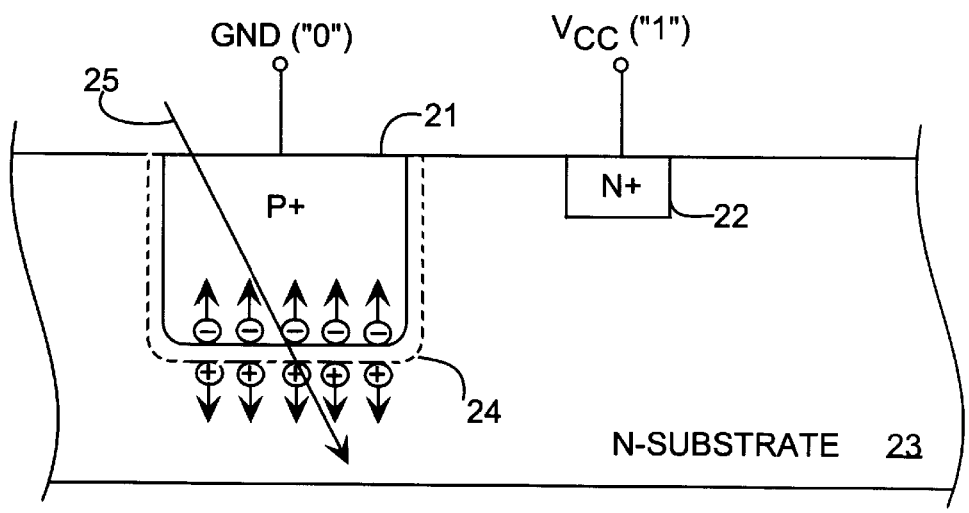
FIG. 2 illustrates a high-energy particle strike at a storage node comprising a P+ diffusion region.

FIG. 2 illustrates a particle strike 25 occurring at a reverse biased PN junction in which diffusion region 21 (P+ diffusion) is formed in N-substrate 23. The substrate 23 is coupled through N+ diffusion region 22 to a logical high potential ($V_{CC}$). In response to the electron-hole pairs generated by particle strike 25, holes are swept into diffusion region 21 and electrons are swept across depletion region 24 into substrate 23. Thus, a storage node represented by diffusion region 21 is vulnerable to soft errors caused by energetic particles when it is at a logical low "0" state and the PN junction is reverse-biased.

Figure 3A:
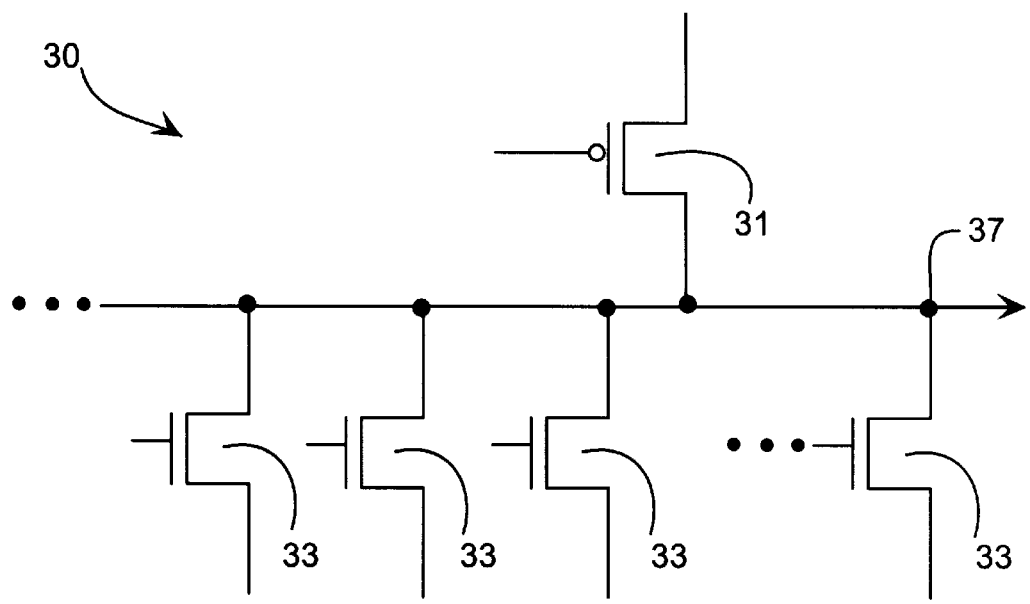
FIG. 3A is a generalized schematic diagram of a logic circuit having a storage node dominated by a N+ diffusion type.

In many CMOS circuits with large diffusion areas at their storage nodes, the diffusions are often not equally divided into N+ and P+ types. Often times, one conductivity type dominates. For example, in FIG. 3A a generalized logic gate 30 is shown having many NMOS transistors 33 coupled in parallel to storage node 37. Gate 30 has only a single PMOS transistor 31 coupled to storage node 37 so that the N+ diffusion associated with NMOS transistors 33 dominates at the storage node.

Figure 4A:
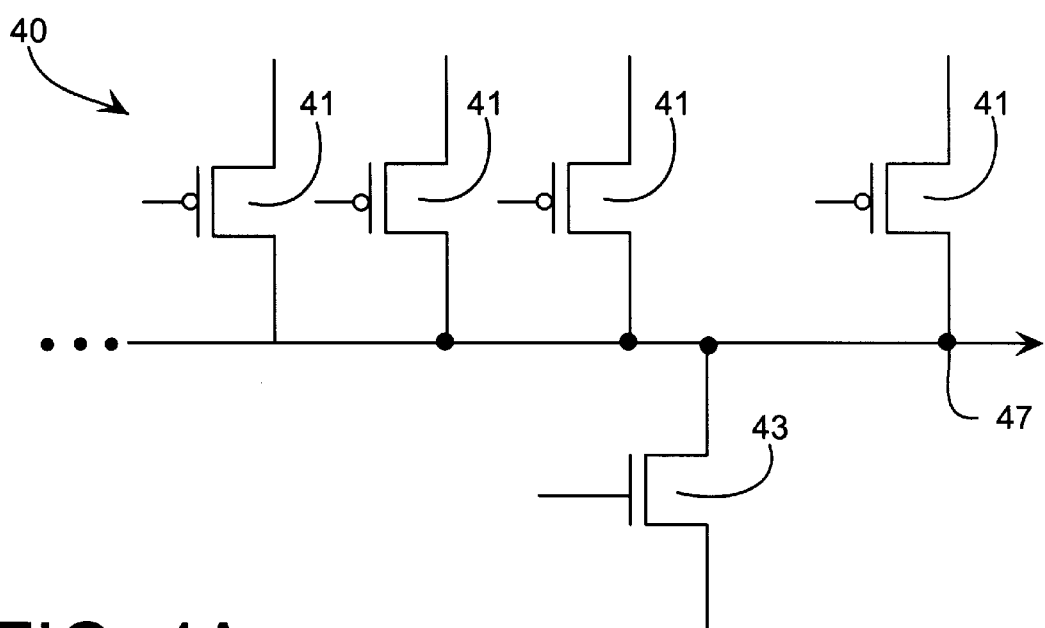
FIG. 4A is a generalized schematic diagram of a logic circuit having a storage node dominated by a P+ diffusion type.

FIG. 4A illustrates the opposite situation with a logic gate 40 being dominated by P+ diffusion at its storage node 47. For the generalized logic gate 40, a single NMOS transistor is shown coupled to storage node 47, whereas a plurality of PMOS transistors 41 are coupled to storage node 47. Thus, for logic gate 40, the P+ type diffusion region coupled to the storage node dominates the soft error rate induced by energetic particles. As a result, the logical "1 to 0" transition is much more critical for logic gate 30 (because it is dominated by the NMOS type gate) while the "0 to 1" state transition is much more critical for logic gate 40 (because it is dominated by the PMOS type gates).

Figure 3B:
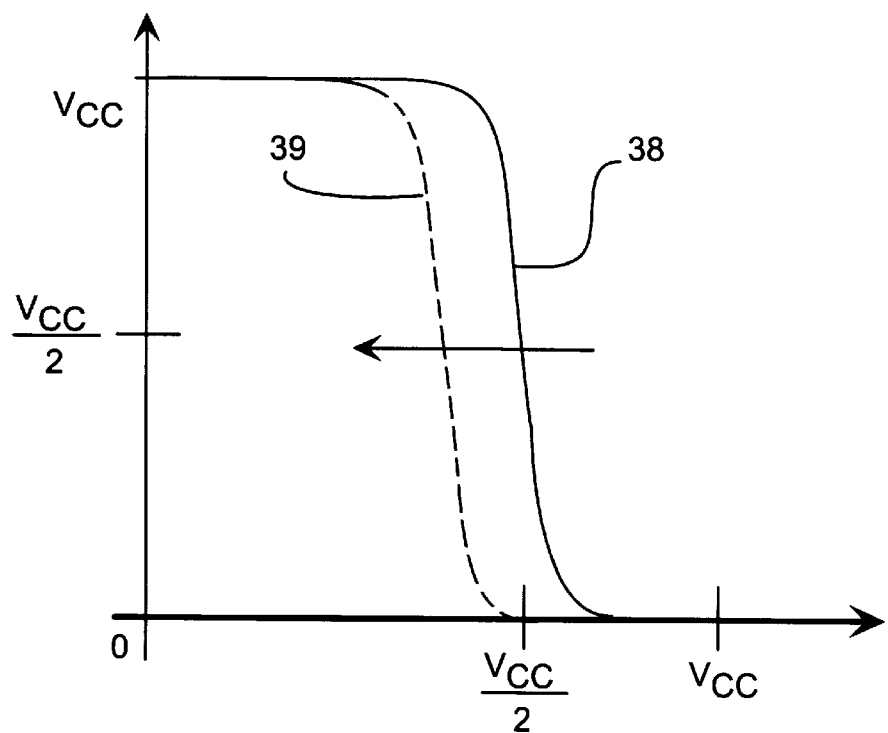
FIG. 3B illustrates optimizing the switching point of the logic circuit shown in FIG. 3A in accordance with the present invention.
Figure 4B:
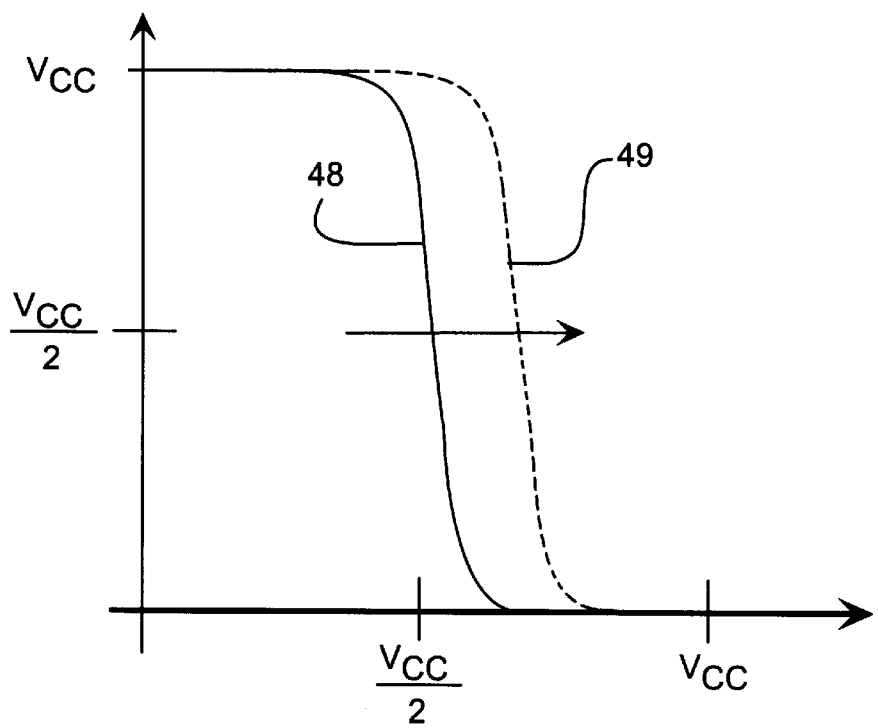
FIG. 4B illustrates optimizing the switching point of the logic circuit shown in FIG. 4A in accordance with the present invention.

To combat these faulty transitions for the two distinguished cases, the present invention teaches optimizing the switching points of CMOS logic gates so as to minimize their soft error failure rates. For example, a CMOS gate may comprise an ordinary inverter. For the two different types of input nodes, the modification in switching points is shown in FIGS. 3B and 4B, respectively. In the case of a CMOS gate that has its input node (e.g., storage node 37) dominated by N+ diffusion, (FIG. 3A) the switching point, which normally is set at $V_{CC}/2$ (shown by waveform 38) is moved toward ground. This is shown in FIG. 3B by dashed line 39, which shows a switching point set at less than $V_{CC}/2$. By moving the switching point closer to ground, it makes it more difficult for a faulty transition to occur from a logical high to a logical low state.

Recall that the "1 to 0" transition is the one that logic gate 30 is most vulnerable to when experiencing a high-energy particle strike. Essentially, what happens is that by moving the switching point to less than $V_{CC}/2$, the noise margin to soft error failures is increased. Practitioners in the art will understand that the shift in switching point potential need not be large. For example, simply moving or shifting the switching point by 100 to 200 millivolts can provide up to 30% increase in the critical charge, $Q_{CRIT}$, stored at node 37. A significant benefit of the invention is that this increase in soft error immunity is achieved without causing other noise issues.

It should be understood that the critical charge, $Q_{CRIT}$, represents the maximum amount of charge that can be injected into a storage node without causing the logic state at that node to flip. Since soft error failure rates are an exponential function of $Q_{CRIT}$ for alpha-induced soft errors, and a power function of $Q_{CRIT}$ for neutron-induced soft errors, the increase of critical charge produces a substantial reduction in soft error rate for various types of CMOS logic circuits.

FIG. 4B illustrates the same approach described above as applied to a logic circuit 40 that is dominated by P+ diffusion. That is, the normal or conventional switching point 48 (and $V_{CC}/2$) is shifted toward $V_{CC}$, as indicated by dashed line 49. In other words, the switching point of A CMOS logic gate, which has its input node (e.g., storage node 47) dominated by PFETs, is adjusted toward $V_{CC}$. In other words, the switching point is made to be greater than $V_{CC}/2$. This combats the vulnerability of circuit 40 to a "0 to 1" transition, resulting in an improvement of circuit robustness against soft error failures.

It is worth repeating that the two transitions in the opposite direction, i.e., the "0 to 1" transition in circuit 30 and the "1 to 0" transition in circuit 40, is of no consequence to the robustness of the respective circuits against soft errors. In each of these two cases there is an adequate noise margin from the respective supply potentials.

It should also be emphasized that the present invention is applicable to the case where either the N+ diffusion or P+ diffusion dominates at the storage node of a logic circuit. The larger the N+ or P+ diffusion with respect to the opposite conductivity type, the more advantageous the present invention is in providing immunity to soft errors.

In summary, the present invention is a simple yet elegant solution that combines the biasing polarities at the device level and the switching points at the circuit level to improve soft error in CMOS circuits. Significant improvements in soft error failure rates are achieved without introducing physical overhead or complexity to the logic gate design. As soft error failures are becoming ever more critical in the reliability of modem logic circuits, the present invention is sure to be beneficial to the semiconductor integrated circuit industry.

I claim:

1. A CMOS logic circuit providing robustness against soft errors comprising:

a gate having an input;

a storage node to store a logic state at the input;

a p-type field-effect transistor (PFET) coupled between a positive supply potential and the storage node;

one or more n-type field-effect transistors (NFETs) coupled between the storage node and a negative supply potential, the NFETs including a N+ diffusion with a response of the storage node to a high-energy particle strike being dominated by the N+ diffusion when the logic state of the storage node is high; and wherein the gate has a switching point that is closer to the negative supply potential than to the positive supply potential.

2. The CMOS logic circuit according to claim 1 wherein the positive supply potential is $V_{CC}$ and the negative supply potential is ground, with the switching point being less than $V_{CC}/2$.

3. The CMOS logic circuit according to claim 1 wherein the PFET and NFETs have a size ratio that establishes the switching point.

4. The CMOS logic circuit according to claim 2 wherein the switching point is approximately in the range of 100–200 millivolts less than $V_{CC}/2$.

5. The CMOS logic circuit according to claim 1 wherein the positive supply potential is $V_{CC}$ and the negative supply potential is $V_{SS}$, with the switching point being less than $V_{CC}-(V_{CC}-V_{SS})/2$.

6. A CMOS logic circuit providing robustness against soft errors comprising:

a gate having an input;

a storage node to store a logic state at the input;

a n-type field-effect transistor (NFET) coupled between the storage node and a negative supply potential and;

one or more p-type field-effect transistors (PFETS) coupled between a positive supply potential and the storage node, the PFETs including a P+ diffusion with a response of the storage node to a high-energy particle strike being dominated by the P+ diffusion when the logic state of the storage node is low; and wherein the gate has a switching point that is closer to the positive supply potential than to the negative supply potential.

7. The CMOS logic circuit according to claim 6 wherein the positive supply potential is $V_{CC}$ and the negative supply potential is ground, with the switching point being greater than $V_{CC}/2$.

8. The CMOS logic circuit according to claim 6 wherein the NFET and PFETs have a size ratio that establishes the switching point.

9. The CMOS logic circuit according to claim 7 wherein the switching point is approximately in the range of 100–200 millivolts greater than $V_{CC}/2$.

10. The CMOS logic circuit according to claim 6 wherein the positive supply potential is $V_{CC}$ and the negative supply potential is $V_{SS}$, with the switching point being greater than $V_{CC}-(V_{CC}-V_{SS})/2$.

* * * * *

UNITED STATES PATENT AND TRADEMARK OFFICE
CERTIFICATE OF CORRECTION

PATENT NO. : 6,087,849
DATED : July 11, 2000
INVENTOR(S) : Kevin X. Zhang

It is certified that error appears in the above-identified patent and that said Letters Patent is hereby corrected as shown below:

<u>Column 3,</u>
Line 32, delete ""0")" and insert the beginning parenthesis mark before the parenthetical expression -- ("0") --.

Signed and Sealed this

Twenty-sixth Day of March, 2002

*Attest:*

*Attesting Officer*

JAMES E. ROGAN
*Director of the United States Patent and Trademark Office*